US010222671B2

(12) United States Patent
Woo et al.

(10) Patent No.: US 10,222,671 B2
(45) Date of Patent: Mar. 5, 2019

(54) THIN FILM TRANSISTOR SUBSTRATE HAVING COLOR FILTER USED FOR AN INSULATING LAYER

(71) Applicant: LG Display Co., Ltd., Seoul (KR)

(72) Inventors: Changseung Woo, Goyang-si (KR); Byunghyun Lee, Paju-si (KR); Soonhwan Hong, Goyang-si (KR); Gyusik Won, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/797,255

(22) Filed: Oct. 30, 2017

(65) Prior Publication Data

US 2018/0120613 A1    May 3, 2018

(30) Foreign Application Priority Data

Oct. 31, 2016    (KR) .......................... 10-2016-0144000

(51) Int. Cl.
*G02F 1/1368*    (2006.01)
*G02F 1/1333*    (2006.01)
(Continued)

(52) U.S. Cl.
CPC ........ *G02F 1/1368* (2013.01); *G02F 1/13439* (2013.01); *G02F 1/133345* (2013.01);
(Continued)

(58) Field of Classification Search
CPC ......... H01L 27/14621; H01L 27/14625; G02F 1/1368
See application file for complete search history.

(56) References Cited

U.S. PATENT DOCUMENTS 7,561,229 B2    7/2009 Lee et al.
8,558,975 B2 *  10/2013 Park ....................... G02B 5/008
                                                 257/E21.499
(Continued)

FOREIGN PATENT DOCUMENTS

CN    104749814 A    7/2015
KR    100959366 B1    1/2005
(Continued)

OTHER PUBLICATIONS

Extended European Search Report issued in European Patent Application No. 17199463.5 dated Mar. 2, 2018.
(Continued)

*Primary Examiner* — Quoc Hoang
(74) *Attorney, Agent, or Firm* — Morgan, Lewis & Bockius LLP

(57) ABSTRACT

The present disclosure relates to a thin film transistor substrate having a color filter layer. The present disclosure provides a thin film transistor substrate comprising: a plurality of pixel areas disposed in a matrix manner on a substrate, each pixel area including an aperture area and a non-aperture area; a first color filter and a second color filter stacked at the non-aperture area on the substrate; an overcoat layer disposed on the first color filter and the second color filter; a semiconductor layer disposed at the non-aperture area on the overcoat layer; a gate insulating layer and a gate electrode stacked on a middle portion of the semiconductor layer; a third color filter at the non-aperture area on the semiconductor layer and the gate electrode; and a source electrode and a drain electrode disposed on the third color filter.

8 Claims, 6 Drawing Sheets

(51) Int. Cl.
*G02F 1/1343* (2006.01)
*G02F 1/1362* (2006.01)
*H01L 27/12* (2006.01)

(52) U.S. Cl.
CPC .. *G02F 1/134309* (2013.01); *G02F 1/136209* (2013.01); *G02F 1/136227* (2013.01); *G02F 1/136286* (2013.01); *H01L 27/124* (2013.01); *G02F 2001/13685* (2013.01); *G02F 2001/136222* (2013.01); *G02F 2001/136231* (2013.01); *G02F 2201/121* (2013.01); *G02F 2201/123* (2013.01)

(56) References Cited

U.S. PATENT DOCUMENTS

| | | |
|---|---|---|
| 2002/0036738 A1 | 3/2002 | Matsumoto |
| 2003/0020851 A1 | 1/2003 | Kim et al. |
| 2004/0109098 A1 | 6/2004 | Kim et al. |
| 2005/0078252 A1 | 4/2005 | Lin |
| 2005/0117083 A1 | 6/2005 | Oh et al. |
| 2005/0253984 A1 | 11/2005 | Kim et al. |
| 2015/0185551 A1 | 7/2015 | Kim et al. |

FOREIGN PATENT DOCUMENTS

| | | |
|---|---|---|
| TW | 583448 A | 4/2004 |
| TW | 200527054 A | 8/2005 |

OTHER PUBLICATIONS

Taiwanese Office Action dated Sep. 25, 2018, issued in corresponding Taiwanese Patent Application No. 106137441.

\* cited by examiner

THIN FILM TRANSISTOR SUBSTRATE HAVING COLOR FILTER USED FOR AN INSULATING LAYER

CROSS-REFERENCE TO RELATED APPLICATION

This application claims priority to Republic of Korea Patent Application No. 10-2016-0144000 filed on Oct. 31, 2016, which is incorporated by reference herein in its entirety.

BACKGROUND

Technical Field

The present disclosure relates to a thin film transistor substrate having a color filter layer. Especially, the present disclosure relates to a thin film transistor substrate in which color filter layers are formed with the thin film transistor and any one color filter layer is used for the intermediate insulating layer of the thin film transistor.

Discussion of the Related Art

The liquid crystal display device represents video data by controlling the light transitivity of the liquid crystal layer using the electric fields. According to the direction of the electric field, the LCD can be classified in the two major types; one is vertical electric field type and the other is the horizontal electric field type.

For the vertical electric field type LCD, a common electrode formed on an upper substrate and a pixel electrode formed on a lower substrate are facing with each other for forming an electric field of which direction is perpendicular to the substrate face. A twisted nematic (TN) liquid crystal layer disposed between the upper substrate and the lower substrate is driven by the vertical electric field. The vertical electric field type LCD has merit of higher aperture ratio, while it has demerit of narrower view angle about 90 degree.

For the horizontal electric field type LCD, a common electrode and a pixel electrode are formed on the same substrate in parallel. A liquid crystal layer disposed between an upper substrate and a lower substrate is driven in In-Plane-Switching (or 'IPS') mode by an electric field parallel to the substrate face. The horizontal electric field type LCD has a merit of wider view angle over 170 degrees and faster response speed than the vertical electric field type LCD. However, the horizontal electric field type LCD may have demerits such as low aperture ratio and transitivity ratio of the back light.

The liquid crystal display widely used in current has the structure in which a thin film transistor substrate having a plurality of thin film transistors arrayed in a matrix manner is joined with a color filter substrate having a plurality of color filters, and a liquid crystal layer is inserted between these two substrates. Otherwise, the liquid crystal display has the structure in which a lower substrate having the color filters and the thin film transistors is joined with an upper substrate, and a liquid crystal layer is inserted between these two substrates.

The structure of color filter is formed on the thin film transistor is called the color filter on thin film transistor (or COT) structure. AS the thin film transistor and the color filter are formed on the same substrate, the manufacturing process for the COT structure is simpler than other structure. Further, as the aligning margin is not considered when joining the two substrates, the high aperture ratio can be easily acquired.

FIG. 1 is a plane view illustrating a thin film transistor substrate for the horizontal field type liquid crystal display according to the related art. FIG. 2 is a cross-sectional view illustrating the structure of the thin film transistor substrate of FIG. 1 by cutting along the line I-I' according to the related art.

Referring to FIGS. 1 and 2, the thin film transistor substrate for the horizontal field type liquid crystal display has the structure in which an (transparent) upper substrate USUB is attached on a (transparent) lower substrate DSUB with a liquid crystal layer LC there-between.

A plurality of color filters CFR, CFG and CFB is disposed in a matrix manner on the inner surface of the upper substrate USUB. In addition, between each neighboring two color filters, a black matrix BM is disposed. The black matrix BM defines each pixel area and one color filter is allocated in one pixel area.

On the lower substrate DSUB, a gate line GL running to the horizontal direction and a data line DL running to the vertical direction are disposed. It is preferable that the gate line GL and the data line DL are disposed as corresponding to the black matrix of the upper substrate USUB. The pixel areas arrayed in a matrix manner are defined by the gate lines GL and the data lines DL crossing each other having a gate insulating layer there-between.

At one corner of the pixel area, a thin film transistor is disposed; the thin film transistor includes a gate electrode G extruded from the gate line GL, a source electrode S extruded from the data line DL and a drain electrode D facing the source electrode S with a predetermined distance. A semiconductor layer A is formed as overlapped with the gate electrode G on the gate insulating layer GI covering the gate electrode G. One side portion of the semiconductor layer A contacts the source electrode S and the other side portion of the semiconductor layer A contact the drain electrode D.

A passivation layer PAS is disposed on the thin film transistor T for protecting the electronic elements. On the passivation layer PAS, a pixel electrode PXL and a common electrode COM are formed of the transparent conductive material. The pixel electrode PXL contacts the drain electrode D through a drain contact hole DH formed at the passivation layer PAS. The pixel electrode PXL has the comb shape in which a plurality of segments is arrayed in parallel with a predetermined distance. The common electrode COM also has the comb shape in which a plurality of segments is arrayed in parallel with a predetermined distance, and alternatively arrayed with the pixel electrode PXL.

Further, the common electrode COM is connected to a common line CL being parallel with the gate line GL. As the result, the electric field is formed in a horizontal direction along to the surface of the lower substrate DSUB between the pixel electrode PXL and the common electrode COM. The liquid crystal layer LC disposed between the upper substrate USUB and the lower substrate DSUB is driven by the horizontal electric field.

For the case of thin film transistor substrate having the COT structure, the thin film transistor and the color filter are formed on the same substrate. FIG. 3 is a cross sectional view illustrating the structure of the thin film transistor substrate for the liquid crystal display having the color filter and the thin film transistor on the same substrate according to the related art. The liquid crystal display having the COT structure comprises an upper substrate USUB a lower substrate DSUB and a liquid crystal layer LC inserted between these two substrates. On the lower substrate DUB, the thin film transistor T and the color filters CFR, CFG and CFB are formed together.

For example, as shown in FIG. 3, the color filter CF is inserted between the gate insulating layer GI and the passivation layer PAS. In this case, the upper substrate USUB has other elements not related to displaying function such as the spacers. The liquid crystal display is formed by joining the upper substrate USUB with the lower substrate DSUB having the color filter CF and the thin film transistor T, and by injecting the liquid crystal layer LC between two substrates.

Even though the COT structure has some merits, the manufacturing process would be complicated because the color filters are formed on the substrate having the thin film transistors. For example, the color filter CF includes three sub color filters representing the red color R, the green color G and the blue color B, respectively. Therefore, at least, three mask processes are required for forming the color filter CF. As the manufacturing processes are complicated, the manufacturing yields would be degraded. Therefore, in order to use the merits of the COT structure, the simplified manufacturing processes are required. Further, it is required that a liquid crystal display adopting the new COT structure according to these manufacturing processes.

SUMMARY

Accordingly, embodiments of the present disclosure are directed to a thin film transistor substrate having a color filter that substantially obviates one or more of the problems due to limitations and disadvantages of the related art.

An aspect of the present disclosure is to provide a liquid crystal display having a thin film transistor and the color filter on a same substrate. Another aspect of the present disclosure is to provide a thin film transistor substrate for a liquid crystal display having the high aperture ratio by which the alignment margin for joining two substrates is not considered. Still another aspect of the present disclosure is to provide a thin film transistor substrate for a liquid crystal display having an ultra high resolution and an ultra high aperture ratio.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a thin film transistor substrate comprises a plurality of pixel areas disposed in a matrix manner on a substrate, each pixel area including an aperture area and a non-aperture area; a first color filter and a second color filter stacked at the non-aperture area on the substrate; an overcoat layer disposed on the first color filter and the second color filter; a semiconductor layer disposed at the non-aperture area on the overcoat layer; a gate insulating layer and a gate electrode stacked on a middle portion of the semiconductor layer; a third color filter at the non-aperture area on the semiconductor layer and the gate electrode; and a source electrode and a drain electrode disposed on the third color filter.

In some embodiments, the thin film transistor substrate further comprises: a planar layer on the source electrode and the drain electrode; a common electrode on the planar layer; a passivation layer on the common electrode; and a pixel electrode contacting the drain electrode on the passivation layer.

In some embodiments, each of the first color filter, the second color filter and the third color filter is any one of a red color filter, a green color filter and a blue color filter.

In some embodiments, the thin film transistor substrate further comprises: a gate line connected to the gate electrode and running to a first direction on the substrate; and a data line connected to the source electrode and running to a second direction on the substrate, wherein the pixel area is defined as an area surrounded by the gate line and the data line.

In some embodiments, the common electrode includes a transparent conductive material covering the aperture area of the pixel area and covering all pixel areas; and the pixel electrode includes the transparent conductive material having a plurality of segments disposed as being parallel each other with a predetermined distance within the aperture area of the pixel area.

In some embodiments, the pixel areas include a first color pixel area, a second pixel area and a third pixel area.

In some embodiments, the first color filter is further disposed at the aperture area of the first color pixel area, the second color filter is further disposed at the aperture area of the second color pixel area, and the third color filter is further disposed at the aperture area of the third color pixel area.

In some embodiments, the thin film transistor substrate further comprises: an intermediate insulating layer on the semiconductor layer and the gate electrode, and under the third color filter.

The thin film transistor substrate for the liquid crystal display according to the present disclosure comprises a thin film transistor and a color filter on the same substrate. Therefore, the alignment margin for joining two substrates is not considered so that the high aperture ratio is ensured. Especially, the present disclosure suggests a best structure which is proper to get high aperture ratio for the liquid crystal display having the ultra high density resolution over UHD rate (or 4K rate) with extremely small pixel area. By stacking at least two color filters at the non-aperture area when forming the color filters on the substrate, the black matrix is not required. Further, using the color filter instead of the intermediate insulating layer, the manufacturing process is simplified.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the invention and are incorporated in and constitute a part of this specification, illustrate embodiments of the disclosure and together with the description serve to explain the principles of the invention.

DETAILED DESCRIPTION

Figure 1:
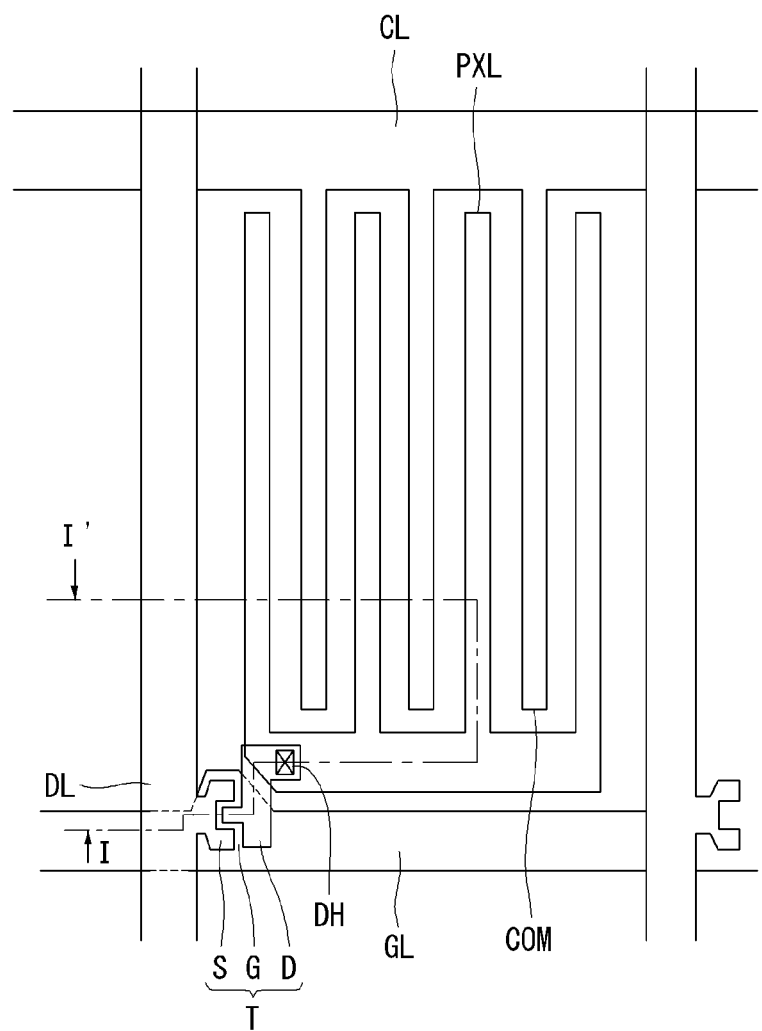
FIG. 1 is a plane view illustrating a thin film transistor substrate for the horizontal field type liquid crystal display according to the related art.
Figure 2:
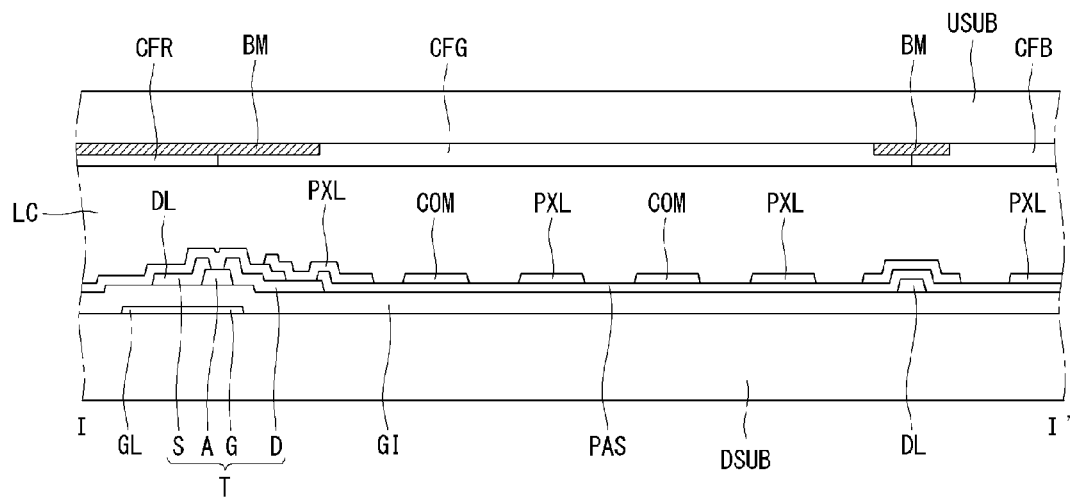
FIG. 2 is a cross-sectional view illustrating the structure of the thin film transistor substrate of FIG. 1 by cutting along the line I-I' according to the related art.
Figure 3:
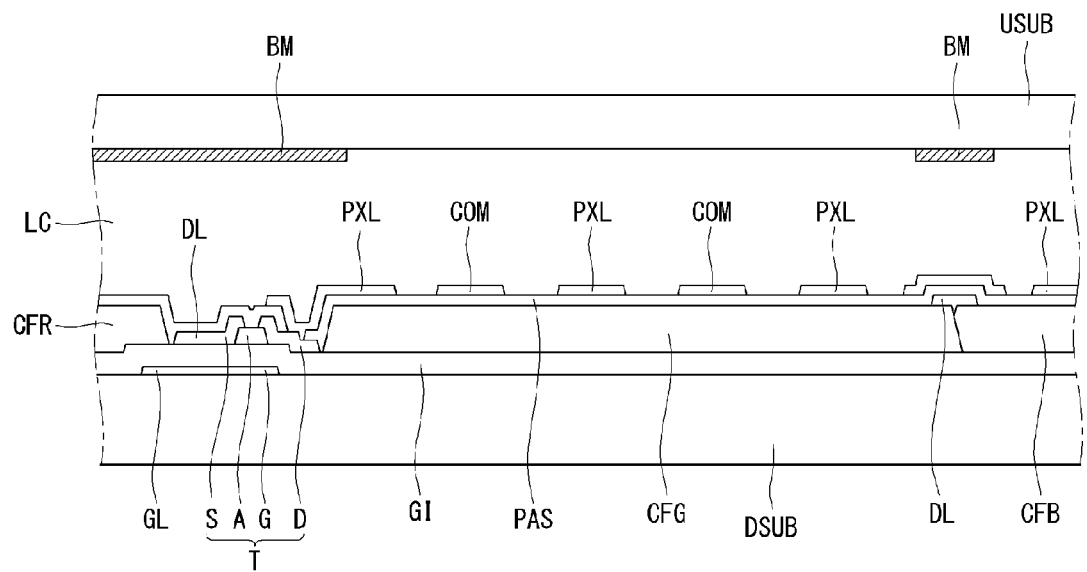
FIG. 3 is a cross sectional view illustrating the structure of the thin film transistor substrate for the liquid crystal display having the color filter and the thin film transistor on the same substrate according to the related art.

Referring to attached figures, preferred embodiments of the present disclosure will be described. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names.

First Embodiment

Figure 4:
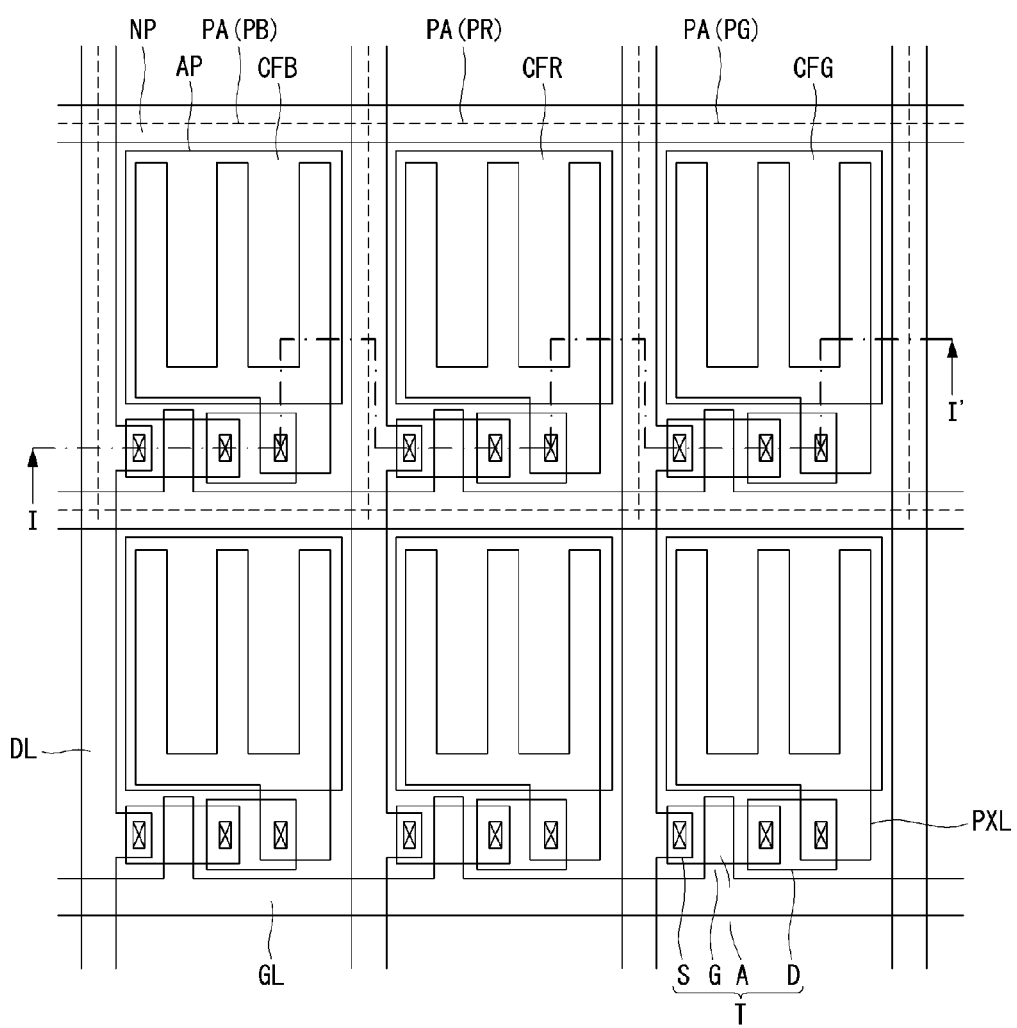
FIG. 4 is a plan view illustrating a structure of a liquid crystal display according to the first embodiment of the present disclosure.
Figure 5:
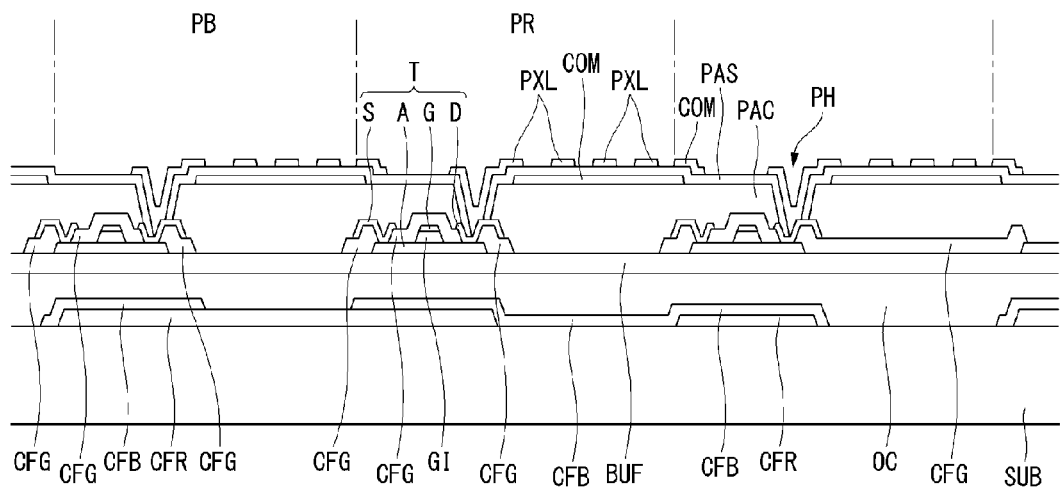
FIG. 5 is a cross sectional view illustrating a structure of a liquid crystal display by cutting along the line I-I' according to the first embodiment of the present disclosure.
Figure 6:
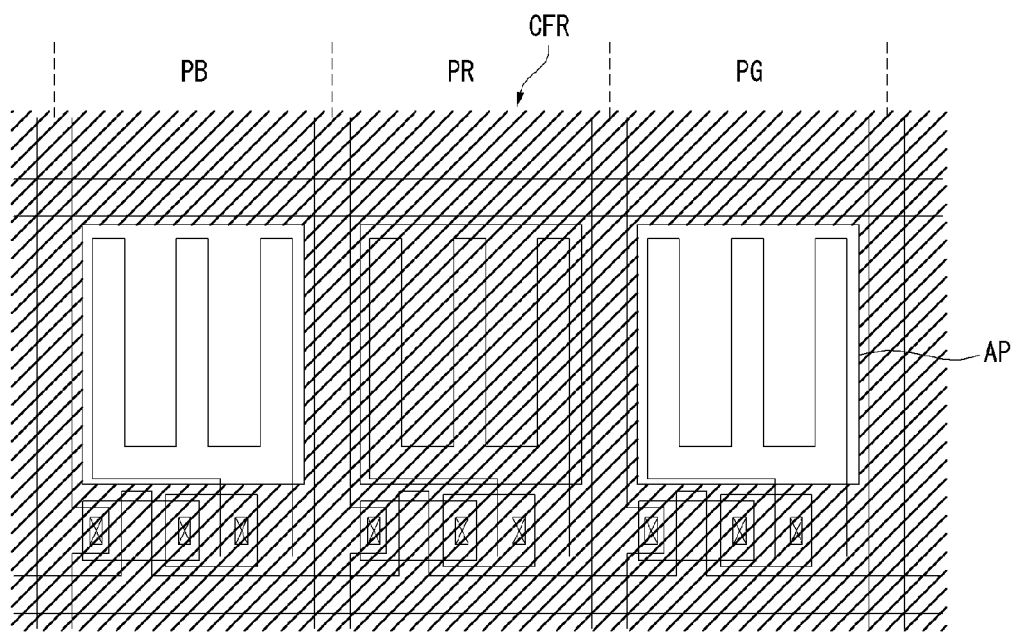
FIGS. 6 to 8 are plan views illustrating the patterns of the color filters according to the first embodiment of the present disclosure.
Figure 7:
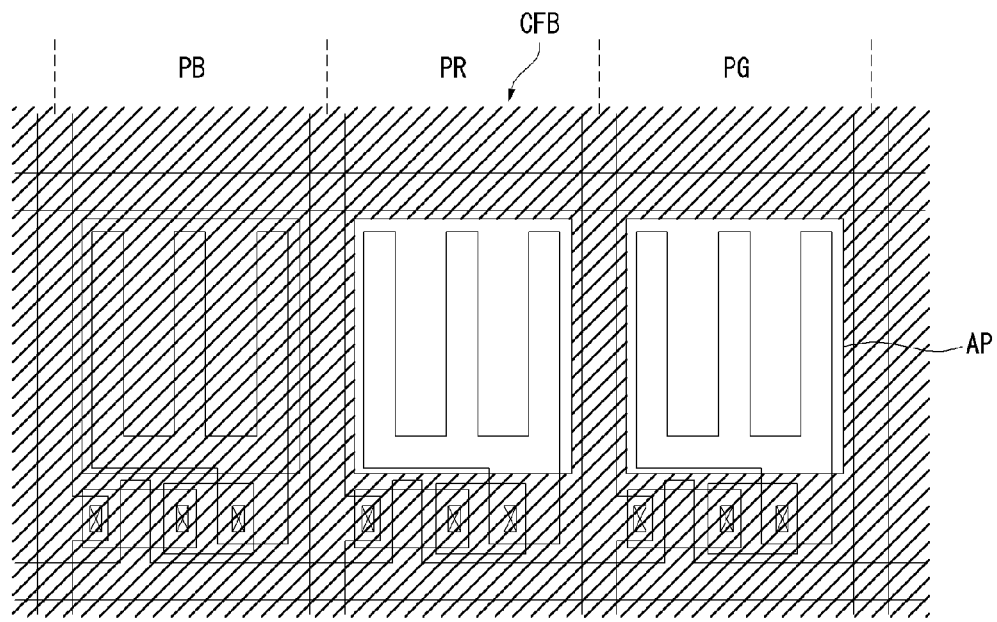
Figure 8:
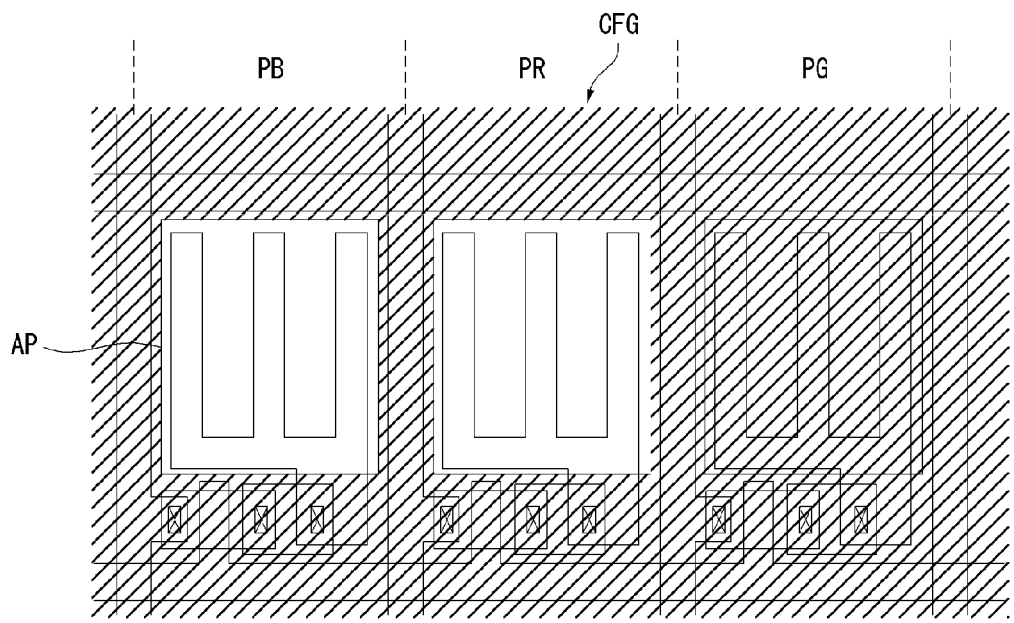

Referring to FIGS. 4 to 8, we will explain about the first embodiment of the present disclosure. FIG. 4 is a plan view illustrating a structure of a liquid crystal display according to the first embodiment of the present disclosure. FIG. 5 is a cross sectional view illustrating a structure of a liquid crystal display by cutting along the line I-I' according to the first embodiment of the present disclosure. FIGS. 6 to 8 are plan views illustrating the patterns of the color filters according to the first embodiment of the present disclosure.

Referring to FIGS. 4 and 5, the liquid crystal display according to the first embodiment of the present disclosure comprises a gate line GL running to a first (i.e., horizontal) direction and a data line DL running to a second (i.e., vertical) direction on a substrate SUB. As a plurality of the gate lines GL is crossing with a plurality of the data lines DL, a plurality of pixel areas PA are defined as arraying in a matrix manner. At each pixel area, a thin film transistor T and a pixel electrode PXL connected to the thin film transistor T are disposed.

The pixel area PA includes an aperture area AP representing the video data and a non-aperture area NP not passing the lights. At the non-aperture area NP, the gate line GL, the data line DL and the thin film transistor T are disposed. At the aperture area AP, the pixel electrode PXL and the common electrode COM are disposed.

In the view point of the cross sectional view, a red color filter CFR is deposited on a substrate SUB. Further, in the plan view point, FIG. 6 is a plan view illustrating an area where the red color filter CFR is deposited. Referring to FIG. 6, the red color filter CFR is deposited at the aperture area AP of the red pixel area PR. In addition, the red color filter CFR covers all non-aperture areas NP except aperture areas AP of the blue pixel areas PB and the green pixel area PG.

In the cross sectional view point, a blue color filter CFB is stacked on the red color filter CFR. In the plan view point, FIG. 7 is a plan view illustrating an area where the blue color filter CFB is deposited. Referring to FIG. 7, the blue color filter CFB is deposited at the aperture area AP of the blue pixel area PB. In addition, the blue color filter CFB covers all non-aperture area NP except aperture areas AP of the red pixel area PR and the green pixel area PG. As the result, at the non-aperture area NP, the blue color filter CFB is directly stacked on the red color filter CFR.

In the cross sectional view point, on the whole surface of the substrate SUB having the red color filter CFR and the blue color filter CFB, an overcoat layer OC is deposited. The overcoat layer OC may make the uneven surface of the substrate SUB, due to the stacked red color filter CFR and the blue color filter CFB, be even and/or smooth.

On the overcoat layer OC, a buffer layer BUF may be deposited. The overcoat layer OC may include an organic material. When the thin film transistor is directly formed on the overcoat layer OC, some defects may be occurred at the interface. In order to prevent the defects, a buffer layer BUF is formed on the overcoat layer OC, using a material having good interface property with the organic material and/or with the inorganic material.

On the buffer layer BUF, a semiconductor layer A is formed. A gate insulating layer GI and a gate electrode G is formed over the middle portion of the semiconductor layer A. The gate insulating layer GI and the gate electrode G have the same shape. The overlapped areas of the semiconductor layer A with the gate electrode G is defined as the channel area. The one side area from the channel area is defined as the source area and the other side area from the channel area is defined as the drain area.

A green color filter CFG is deposited on the substrate SUB having the semiconductor layer A and the gate electrode G. In the plan view point, FIG. 8 is a plan view illustrating an area where the green color filter CFG is deposited. Referring to FIG. 8, the green color filter CFG is disposed at the aperture area AP of the green pixel area PG. In addition, the green color filter CFG covers all non-aperture areas NP except the aperture areas AP of the blue pixel area PB and the red pixel area PR.

As the semiconductor layer A and the gate electrode G are disposed at the non-aperture area NP, the green color filter CFG covers all of the semiconductor layers A disposed at all pixel areas including the blue pixel area PB, the red pixel area PR and the green pixel area PG. The green color filter CFG has some contact holes for exposing the source area and the drain area of the semiconductor layer A. That is, the green color filter CFG is used for an intermediate insulating layer covering the gate electrode G.

On the green color filter CFG, a data line DL, a source electrode S and a drain electrode D is formed. The source electrode S is extruded from the data line DL and contacts the source area of the semiconductor layer A. The drain electrode D contacts the drain area of the semiconductor layer A. The thin film transistor T is completed.

On the thin film transistor T, a planar layer PAC is deposited as covering the whole surface of the substrate SUB. A pixel contact hole PH is formed at the planar layer PAC for exposing the drain electrode D. On the planar layer PAC, a common electrode COM is formed. The common electrode COM may be a transparent conductive layer deposited whole surface of the substrate. It is preferable that the common electrode COM does not cover the pixel contact hole PH.

On the common electrode COM, a passivation layer PAS is deposited as covering the whole surface of the substrate SUB. The passivation layer PAS also has the pixel contact hole PH for exposing the drain electrode D. On the passivation layer PAS, a pixel electrode PXL is formed. The pixel electrode PXL contact the drain electrode D through the pixel contact hole PH.

The thin film transistor substrate having the color filters CFR, CFG and CFB according to the present disclosure has a structure in which the red color filter CFR, the blue color filter CFB and the green color filter CFG are sequentially stacked at the non-aperture area NP. Therefore, without extra black matrix, the stacked color filters CFR, CFG and CFB works as the black matrix between each neighboring two pixel areas. In addition, the green color filter CFG works as the intermediate insulating layer between the gate line GL and the data line DL. As the results, the mask processes required for forming the black matrix and the intermediate insulating layer are not required. In other words, the manufacturing process for the liquid crystal display according to the present disclosure reduces at least two mask processes than the related art. The manufacturing tack time can be shortened and the manufacturing yield can be increased.

The red color CFR, the green color filter CFG and the blue color filter CFB are formed with the thin film transistor T and the pixel electrode PXL on the same substrate SUB. The black matrix is formed as stacking the color filters. Therefore, the mis-alignment is not occurred so that the aligning margin is not considered. As the result, the aperture ratio can be ensured in a maximum value.

In the above description, we explained that the color filters are stacked in the order of red, blue and then green. However, it is not restricted with this stacking order. If required, the stacking order may be different. Preferably, the color filter used for the intermediate insulating layer would be the green color filter CFG. The green color filter CFG is better than other color filters for forming the contact holes exposing the source area and the drain area of the semiconductor layer A.

Second Embodiment

Figure 9:
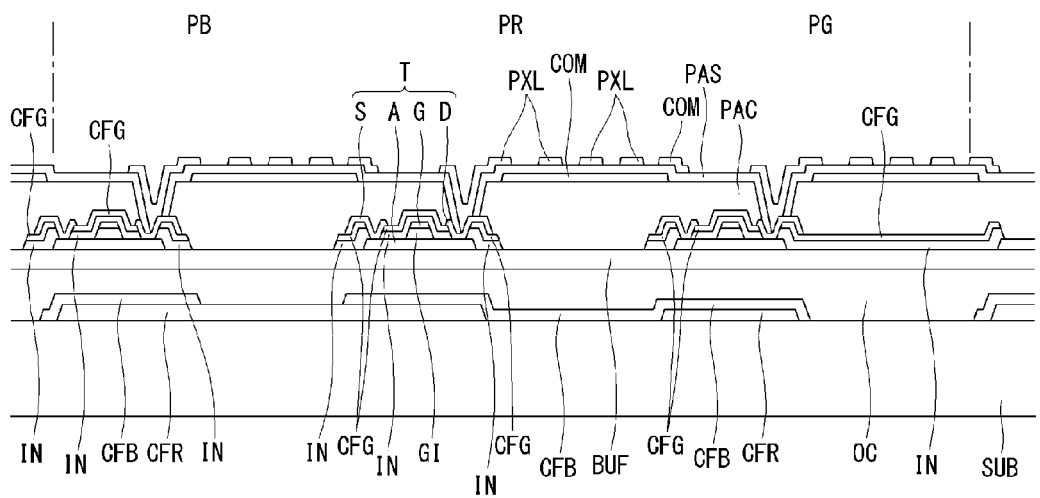
FIG. 9 is a cross sectional view illustrating a structure of a liquid crystal display according to the second embodiment of the present disclosure.

Hereinafter, referring to FIG. 9, we will explain about the second embodiment of the present disclosure. In the first embodiment, we explained about the structure of the liquid crystal display in which the green color filter is used for the intermediate insulating layer. In the second embodiment, we will explain about the structure of the liquid crystal display in which an extra intermediate insulating layer is included. FIG. 9 is a cross sectional view illustrating a structure of a liquid crystal display according to the second embodiment of the present disclosure.

The structure of the liquid crystal display according to the second embodiment of the present disclosure is very similar with that of the first embodiment. The difference is on that an additional intermediate insulating layer is included under the green color filter.

Referring to FIG. 9, a red color filter CFR is firstly deposited on a substrate SUB. The red color filter CFR has the same pattern with that of the first embodiment. The red color filter CFR may be deposited at hatched area shown in FIG. 6. For example, the red color filter CFR is deposited at the aperture area AP of the red pixel area PR. In addition, the red color filter CFR covers all non-aperture areas NP except aperture areas AP of the blue pixel areas PB and the green pixel area PG.

In the cross sectional view point, a blue color filter CFB is stacked on the red color filter CFR. The blue color filter CFB has the same pattern with that of the first embodiment. The blue color filter CFB may be deposited at hatched area shown in FIG. 7. For example, the blue color filter CFB is deposited at the aperture area AP of the blue pixel area PR. In addition, the blue color filter CFB covers all non-aperture areas NP except aperture areas AP of the red pixel areas PR and the green pixel area PG. As the result, at the non-aperture area NP, the blue color filter CFB is directly stacked on the red color filter CFR.

In the cross sectional view point, on the whole surface of the substrate SUB having the red color filter CFR and the blue color filter CFB, an overcoat layer OC is deposited. The overcoat layer OC may make the uneven surface of the substrate SUB, due to the stacked red color filter CFR and the blue color filter CFB, be even and/or smooth.

On the overcoat layer OC, a buffer layer BUF may be deposited. The overcoat layer OC may include an organic material. When the thin film transistor is directly formed on the overcoat layer OC, some defects may be occurred at the interface. In order to prevent the defects, a buffer layer BUF is formed on the overcoat layer OC, using a material having good interface property with the organic material and/or with the inorganic material.

On the buffer layer BUF, a semiconductor layer A is formed. A gate insulating layer GI and a gate electrode G is formed over the middle portion of the semiconductor layer A. The gate insulating layer GI and the gate electrode G have the same shape. The overlapped areas of the semiconductor layer A with the gate electrode G is defined as the channel area. The one side area from the channel area is defined as the source area and the other side area from the channel area is defined as the drain area.

An intermediate insulating layer IN is deposited on the substrate SUB having the semiconductor layer A and the gate electrode G. A green color filter CFG is deposited on the intermediate insulating layer IN. The green color filter may have the same pattern with that of the first embodiment. In the plan view point, FIG. 8 is a plan view illustrating an area where the green color filter CFG is deposited. Referring to FIG. 8, the green color filter CFG is disposed at the aperture area AP of the green pixel area PG. In addition, the green color filter CFG covers all non-aperture areas NP except the aperture areas AP of the blue pixel area PB and the red pixel area PR. The intermediate insulating layer IN may cover the same area and have the same pattern as the green color filter CFG.

On the intermediate insulating layer IN, a data line DL, a source electrode S and a drain electrode D are formed. The intermediate insulating layer IN and the green color filter CFG have some contact holes for exposing the source area and the drain area of the semiconductor layer A. The source electrode S is extruded from the data line DL and contacts the source area of the semiconductor layer A. The drain electrode D contacts the drain area of the semiconductor layer A. The thin film transistor T is completed.

On the thin film transistor T, a planar layer PAC is deposited as covering the whole surface of the substrate SUB. A pixel contact hole PH is formed at the planar layer PAC for exposing the drain electrode D. On the planar layer PAC, a common electrode COM is formed. The common electrode COM may be a transparent conductive layer deposited whole surface of the substrate. It is preferable that the common electrode COM does not cover the pixel contact hole PH.

On the common electrode COM, a passivation layer PAS is deposited as covering the whole surface of the substrate SUB. The passivation layer PAS also has the pixel contact hole PH for exposing the drain electrode D. On the passivation layer PAS, a pixel electrode PXL is formed. The pixel electrode PXL contact the drain electrode D through the pixel contact hole PH.

The thin film transistor substrate having the color filters CFR, CFG and CFB according to the present disclosure has a structure in which the red color filter CFR, the blue color filter CFB and the green color filter CFG are sequentially stacked at the non-aperture area NP. Therefore, without extra black matrix, the stacked color filters CFR, CFG and CFB works as the black matrix between each neighboring two pixel areas. In addition, the intermediate insulating layer IN is stacked under the green color filter CFG and patterned with the green color filter CFG at the same time, so that the intermediate insulating layer IN has the same shape with the green color filter CFG. As the results, the mask processes required for forming the black matrix and the intermediate insulating layer are not required. In other words, the manufacturing process for the liquid crystal display according to the present disclosure reduces at least two mask processes than the related art. The manufacturing tack time can be shortened and the manufacturing yield can be increased.

The all color filters including the red color CFR, the green color filter CFG and the blue color filter CFB are formed with the thin film transistor T and the pixel electrode PXL on the same substrate SUB. The black matrix is formed as stacking the color filters. Therefore, the mis-alignment is not occurred so that the aligning margin is not considered. As the result, the aperture ratio can be ensured in a maximum value.

In the above description, we explained that the color filters are stacked in the order of red, blue and then green. However, it is not restricted with this stacking order. If required, the stacking order may be different. Preferably, the color filter deposited over the intermediate insulating layer IN would be the green color filter CFG. The green color filter CFG is better than other color filters for forming the contact holes exposing the source area and the drain area of the semiconductor layer A.

It will be apparent to those skilled in the art that various modifications and variations can be made in the thin film transistor substrate having a color filter of the present disclosure without departing from the technical idea or scope of the disclosure. Thus, it is intended that the present disclosure cover the modifications and variations of this disclosure provided they come within the scope of the appended claims and their equivalents.

What is claimed is:

1. A thin film transistor substrate, comprising:
    a plurality of pixel areas disposed in a matrix manner on a substrate, each pixel area including an aperture area and a non-aperture area;
    a first color filter and a second color filter stacked at the non-aperture area on the substrate;
    an overcoat layer disposed on the first color filter and the second color filter;
    a semiconductor layer disposed at the non-aperture area on the overcoat layer;
    a gate insulating layer and a gate electrode stacked on a middle portion of the semiconductor layer;
    a third color filter at the non-aperture area on the semiconductor layer and the gate electrode; and
    a source electrode and a drain electrode disposed on the third color filter.

2. The thin film transistor substrate according to the claim 1, further comprising:
    a planar layer on the source electrode and the drain electrode;
    a common electrode on the planar layer;
    a passivation layer on the common electrode; and
    a pixel electrode contacting the drain electrode on the passivation layer.

3. The thin film transistor substrate according to the claim 2,
    wherein the common electrode includes a transparent conductive material covering the aperture area of the pixel area and covering all pixel areas; and
    wherein the pixel electrode includes the transparent conductive material having a plurality of segments disposed as being parallel each other with a predetermined distance within the aperture area of the pixel area.

4. The thin film transistor substrate according to the claim 1, wherein each of the first color filter, the second color filter and the third color filter is any one of a red color filter, a green color filter and a blue color filter.

5. The thin film transistor substrate according to the claim 1, further comprising:
    a gate line connected to the gate electrode and running to a first direction on the substrate; and
    a data line connected to the source electrode and running to a second direction on the substrate,
    wherein the pixel area is defined as an area surrounded by the gate line and the data line.

6. The thin film transistor substrate according to the claim 1, wherein the pixel areas include a first color pixel area, a second pixel area and a third pixel area.

7. The thin film transistor substrate according to the claim 6,
    wherein the first color filter is further disposed at the aperture area of the first color pixel area,
    wherein the second color filter is further disposed at the aperture area of the second color pixel area, and
    wherein the third color filter is further disposed at the aperture area of the third color pixel area.

8. The liquid crystal display according to the claim 7, further comprising:
    an intermediate insulating layer on the semiconductor layer and the gate electrode, and under the third color filter.

* * * * *